(12) United States Patent
Immel et al.

(10) Patent No.: US 7,814,760 B2
(45) Date of Patent: Oct. 19, 2010

(54) COOLING DEVICE

(75) Inventors: Manfred Immel, Mittenaar (DE);
Joachim Maul, Ehringshausen (DE)

(73) Assignee: Rittal GmbH & Co. KG, Herborn (DE)

( * ) Notice: Subject to any disclaimer, the term of this patent is extended or adjusted under 35 U.S.C. 154(b) by 82 days.

(21) Appl. No.: 11/789,022

(22) Filed: Apr. 23, 2007

(65) Prior Publication Data
US 2008/0028783 A1 Feb. 7, 2008

(30) Foreign Application Priority Data
Apr. 22, 2006 (DE) .................. 10 2006 020 506

(51) Int. Cl.
*F25D 19/00* (2006.01)
*F01D 5/02* (2006.01)
(52) U.S. Cl. .............. 62/295; 62/296; 415/140
(58) Field of Classification Search .......... 62/295–296, 62/466, 279, 441, 259.1, 529, 262; 415/119, 415/140–141; 417/363
See application file for complete search history.

(56) References Cited

U.S. PATENT DOCUMENTS

| | | | | |
|---|---|---|---|---|
| 2,205,831 A | * | 6/1940 | Hartman | 96/223 |
| 2,661,836 A | * | 12/1953 | Jewell | 206/320 |
| 2,885,142 A | * | 5/1959 | Eberhart | 417/350 |
| 5,306,121 A | * | 4/1994 | Heflin et al. | 417/363 |
| 5,839,295 A | * | 11/1998 | Lehmann | 62/498 |
| 6,260,373 B1 | * | 7/2001 | Rockwood | 62/295 |
| 2005/0257554 A1 | * | 11/2005 | Yun et al. | 62/295 |

FOREIGN PATENT DOCUMENTS

JP 05045038 * 2/1993

* cited by examiner

*Primary Examiner*—Frantz F Jules
*Assistant Examiner*—Cassey Bauer
(74) *Attorney, Agent, or Firm*—Pauley Petersen & Erickson

(57) ABSTRACT

A cooling device, in particular for a switchgear cabinet with a housing, in which a refrigeration cycle system is housed, wherein the refrigeration cycle system has vibration-generating elements, namely a compressor and at least one fan. The fan and the compressor are supported in the housing via vibration dampers. For preventing vibratory emissions a cooling device in accordance with this invention has the fan and/or the compressor separately supported by first vibration dampers on an intermediate bracket, or together on an intermediate bracket. The intermediate bracket is supported by second vibration dampers on a bracket, and the bracket is connected to the housing.

12 Claims, 3 Drawing Sheets

COOLING DEVICE

BACKGROUND OF THE INVENTION

1. Field of the Invention

This invention relates to a cooling device, in particular for a switchgear cabinet with a housing, in which a refrigeration cycle system is housed, wherein the refrigeration cycle system has vibration-generating elements, including a compressor and at least one fan, wherein the fan and the compressor are supported in the housing via vibration dampers.

2. Discussion of Related Art

Cooling devices are known in the prior art. The refrigeration cycle system is formed by a compression refrigeration system having a compressor, an evaporator, a condenser, an expansion valve, pipelines and fans. The motors of the fans and of the compressor cause vibrations, which are transferred to the housing of the cooling device, and then to the connected switchgear cabinet.

When the cooling device is installed on a machine tool, this can be disadvantageous, because the vibrations are then transmitted to the processing head of the machine tool. The vibrations negatively affect the processing results of the machine tool so that unevenness is created on the surface of the workpiece being processed.

Known compressors have been seated on vibration dampers to circumvent this disadvantage. It is thus possible to achieve some improvement which, however, has not been considered to be sufficient.

SUMMARY OF THE INVENTION

It is one object of this invention to provide a cooling device of the type mentioned above but which, if possible, transmits no vibrations to a connected component, in particular a machine tool, during employment.

This object is attained if the fan and/or the compressor are separately supported by first vibration dampers on an intermediate bracket, or together on an intermediate bracket. The intermediate bracket is supported by second vibration dampers on a bracket, and the bracket is connected to the housing.

Thus the fans and the compressor are decoupled from the housing by a vibration plane formed by the intermediate bracket. It has been shown that, for practical purposes, with such an arrangement no interfering vibrations are transmitted from the cooling device to the processing head of the machine tool.

In accordance with one embodiment of this invention, the refrigeration circuit system has two fans, each of which is respectively assigned to an air circuit, and the two fans are respectively supported on the housing by a first and a second vibration damper, and by their respective intermediate brackets.

To be able to achieve a stable support of the compressor, the intermediate bracket which supports the compressor is embodied as a sheet metal component, which has bevels along the edges. The bevels stiffen the intermediate bracket and thus form a sufficiently rigid component.

A simple construction for fastening the compressor in the cooling device results if the intermediate bracket supporting the compressor is supported by the second vibration dampers on the bracket embodied as a console, and if the bracket is welded to the housing.

In order to be able to house each fan in a space-saving manner in the cooling device, in one embodiment of this invention, the fan is arranged in the area between the bracket and the intermediate bracket, the bracket is connected by spacing elements to the intermediate bracket, and the intermediate bracket is connected with the spacing elements by the second vibration dampers.

To reduce the parts outlay in such a construction, the bracket itself can carry the air nozzle, which is preferably formed in one piece on the bracket. In that case, the bracket can be made, for example, as a stamped and bent element from a sheet metal blank.

In one embodiment of this invention, the vibration damper has a damping element, which has a cylindrical holding shoulder and a collar section adjoining it. A further damping element with a bore is pushed on the holding shoulder, and a plate-shaped section of the bracket or of the intermediate bracket is clampingly held between the further damping element and the collar section. In this case, the vibration damper can be easily mounted and it is only necessary to provide a bore in the bracket or the intermediate bracket, into which the cylindrical holding shoulder is pushed.

BRIEF DESCRIPTION OF THE DRAWINGS

This invention is described in view of an exemplary embodiment shown in the drawings, wherein.

DETAILED DESCRIPTION OF PREFERRED EMBODIMENTS

Figure 1:
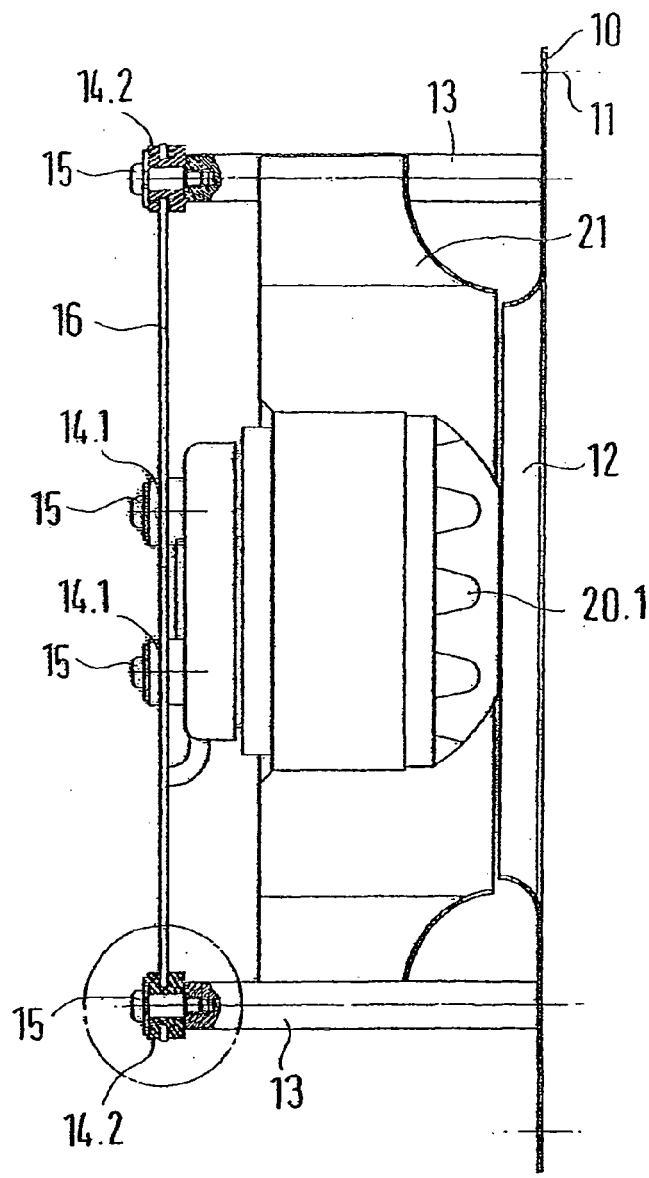
FIG. 1 is a lateral view of a fan for a cooling device mounted in a bracket arrangement.
Figure 2:
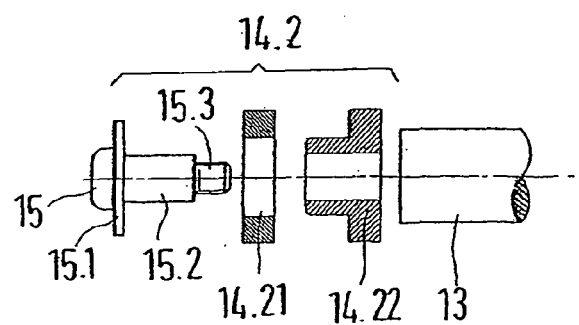
FIG. 2 is an exploded view of a detail identified as a circled section in FIG. 1.
Figure 4:
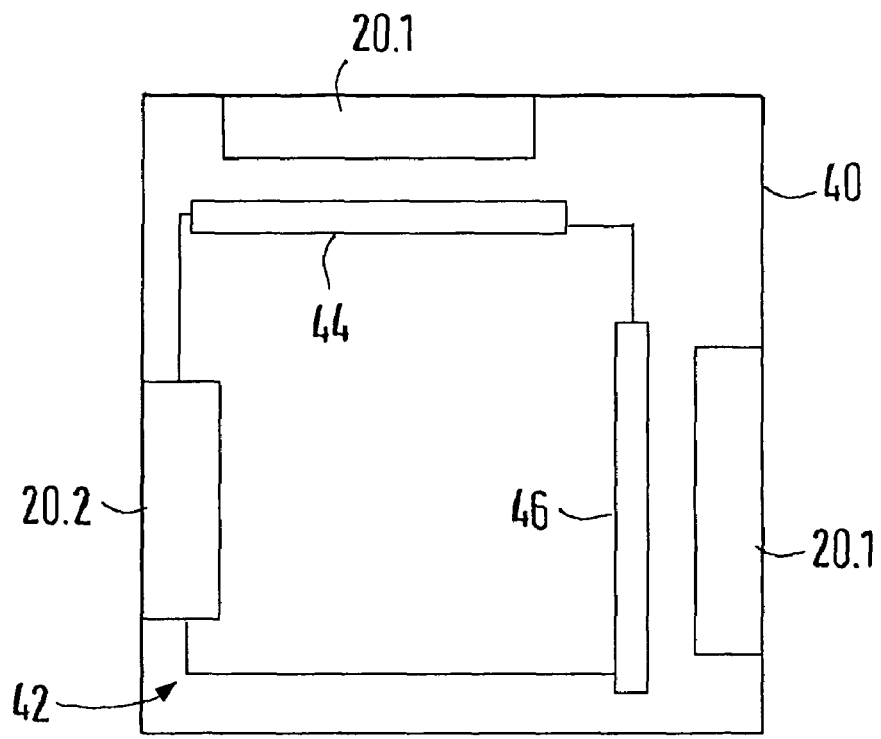
FIG 4 is a schematic illustration of a cooling device according to one embodiment of this invention.

Portions of a cooling device are shown in the drawings, which can be attached to a housing receiving electrical installations, for example a switchgear cabinet. In turn, the switchgear cabinet can be attached to a machine tool. As illustrated in FIG. 4, the cooling device within housing 40 has a refrigeration cycle system 42, in which coolant is conveyed. At least two fans 20.1 are part of the refrigeration cycle system 42, one of which is respectively assigned to an evaporator 44 or a condenser 46 of the refrigeration cycle system 42. As shown in FIG. 1, the fan 20.1 is mounted via vibration dampers 14.1 on an intermediate bracket 16. The intermediate bracket 16 can be a sheet metal plate covering the back of the fan 20.1. The intermediate bracket 16 has bores along the edges, in which vibration dampers 14.2 can be mounted. The structure of the vibration dampers 14.2 are shown in greater detail in FIG. 2. As shown, the vibration damper 14.2 has a damping element 14.22, which has a cylindrical holding shoulder and a collar section of enlarged diameter connected with it. A second ring-shaped damping element 14.21 can be pushed on the damping element. The second damping element 14.21 has an interior diameter which approximately corresponds to the exterior diameter of the cylindrical holding shoulder. A bore passes through the damping element 14.22.

A fastening screw 15 can be pushed through the bore and its threaded start can be screwed into a threaded receiver of a spacing element 13. Following its screw head, the fastening screw 15 has a thrust washer 15.1. A pin 15.2 follows the thrust washer 15.1 and is inserted into the bore of the second damping element 14.22.

For mounting the vibration damper 14.2, the cylindrical holding shoulder of the damping element 14.22 is inserted into the bore in the intermediate bracket 16 thus provided. The ring-shaped damping element 14.21 is then pushed over the area of the holding shoulder projecting beyond the back of the intermediate bracket 16. In this case, the plate-shaped intermediate bracket 16 is maintained between the two damping elements 14.21 and 14.22. If the fastening screw 15 is screwed into the spacing element 13, the front and rear sides of the damping elements 14.21 and 14.22 are clamped together with the intermediate bracket. Because of the radial force exerted by the thrust washer 15.1, the holding shoulder is radially widened, and thus is also clamped in the bore.

A bracket 10 is screwed onto the end of the spacing elements 13 facing away from the damping elements 14.2. The bracket 10 can be plate-shaped and arranged parallel with the intermediate bracket 16. The bracket 10 covers the aspirating side of the fan 20.1 and can be a stamped and bent element, wherein an air nozzle 12 is cut out of the center in the form of an opening in the bracket 10. Here, the edge of the opening is drawn in the direction toward the fan 20.1. Thus the bracket 10 and the intermediate bracket 16 form a frame for the fan 20.1 designed as a radial fan, which can be simultaneously used as a portion of the air guidance.

The bracket 10 has fastening receivers 11 along the edges, by which it can be screwed to the cooling device housing.

Figure 3:
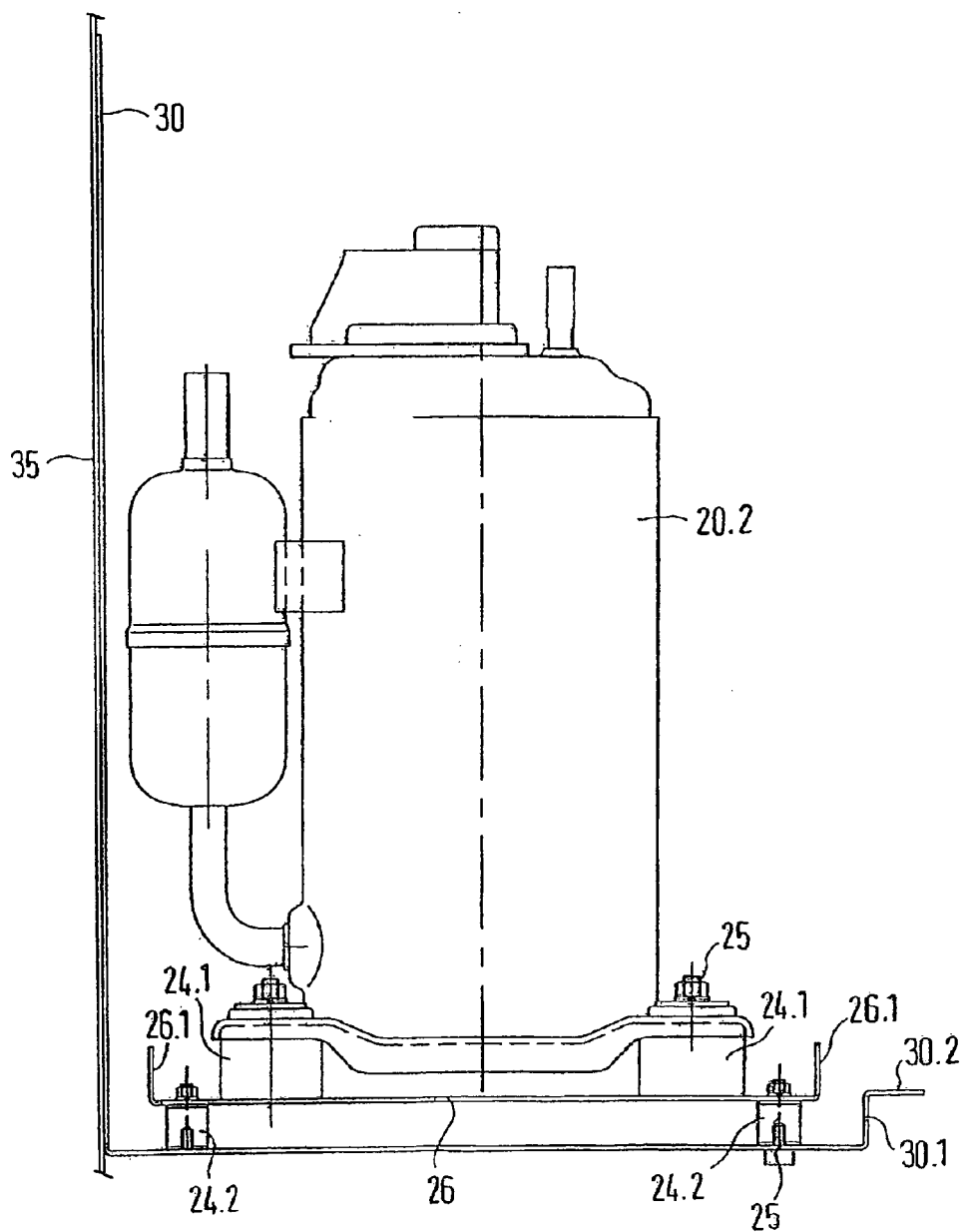
FIG. 3 is a lateral view of a compressor for the cooling device mounted on a bracket arrangement.

A suspension device for the compressor 20.2 of the refrigeration cycle system is shown in FIG. 3. The compressor 20.2 is placed on the intermediate bracket 26 by first vibration dampers 24.1 and is screwed together with it, such as with fastening screws 25. The intermediate bracket 26 is designed tub-shaped and has laterally beveled edges 26.1, which are used for stiffening.

The intermediate bracket 26 is screwed together, such as with fastening screws 25, with a bracket 30 by further damping elements 24.2, so that the bracket 30 and the intermediate bracket 26 are vibrationally decoupled.

The bracket 30 can be a console and can have a vertical fastening section, by which it can be connected with the cooling device housing 35, for example welded to it. For the purpose of stiffening, the bracket 30 has bevels 30.1, 30.2.

German Patent Reference 10 2006 020 506.5, the priority document corresponding to this invention, and its teachings are incorporated, by reference, into this specification.

What is claimed is:

1. A cooling device for a switchgear cabinet with a housing, in which a refrigeration cycle system is housed, wherein the refrigeration cycle system has vibration-generating elements including a compressor (20.2), a first fan (20.1) and a second fan (20.1) each respectively assigned to an air circuit, the cooling device comprising:
    the first fan (20.1) directly supported by a first intermediate bracket (16) via first vibration dampers (14.1), the first intermediate bracket (16) directly supported by a first bracket (10) via second vibration dampers (14.2), the first bracket (10) directly connected to the housing;
    the second fan (20.1) directly supported by a second intermediate bracket (16) via third vibration dampers (14.1), the second intermediate bracket (16) directly supported by a second bracket (10) via fourth vibration dampers (14.2), the second bracket (10) directly connected to the housing;
    the compressor (20.2) directly supported by a third intermediate bracket (26) via fifth vibration dampers (24.1), the third intermediate bracket (26) directly supported by a third bracket (30) via sixth vibration dampers (24.2), the third bracket (30) directly connected to the housing; and
    wherein the third bracket (30) supporting the third intermediate bracket (26) that is supporting the compressor (20.2) is embodied as a console (30) and is welded to the housing, and the third intermediate bracket (26) which supports the compressor (20.2) is a sheet metal component with bevels (26.1) along edges.

2. The cooling device in accordance with claim 1, wherein the first fan (20.1) is arranged in an area between the first bracket (10) and the first intermediate bracket (16) supporting the first fan, and the first bracket (10) is connected by spacing elements (13) to the first intermediate bracket (16) supporting the second fan.

3. The cooling device in accordance with claim 2, wherein the first intermediate bracket (16) supporting the first fan is connected with the spacing elements (13) by the second vibration dampers (14.2).

4. The cooling device in accordance with claim 3, wherein a first air nozzle (12) is formed on the first bracket (10), which is directed to an aspiration area of the first fan (20.1).

5. The cooling device in accordance with claim 4, wherein at least one of the vibration dampers has a damping element with a cylindrical holding shoulder and an adjoining collar section, a further damping element with a bore is pushed on the holding shoulder, and a plate-shaped section of one of the brackets and a respective intermediate bracket supporting one of the first fan, the second fan or the compressor is clampingly held between the damping element and the collar section.

6. The cooling device in accordance with claim 1, wherein the second fan (20.1) is arranged in an area between the second bracket (10) and the second intermediate bracket (16) supporting the second fan, and the second bracket (10) is connected by spacing elements (13) to the second intermediate bracket (16) supporting the second fan.

7. The cooling device in accordance with claim 6, wherein the second intermediate bracket (16) supporting the second fan is connected with the spacing elements (13) by the fourth vibration dampers (14.2).

8. The cooling device in accordance with claim 2, wherein a first air nozzle (12) is formed on the first bracket (10), which is directed to an aspiration area of the first fan (20.1).

9. The cooling device in accordance with claim 1, wherein at least one of the vibration dampers has a damping element with a cylindrical holding shoulder and an adjoining collar section, a further damping element with a bore is pushed on the holding shoulder, and a plate-shaped section of one of the brackets and a respective intermediate bracket supporting one of the first fan, the second fan or the compressor is clampingly held between the damping element and the collar section.

10. The cooling device in accordance with claim 1, wherein the console comprises a vertical fastening section welded to the housing.

11. The cooling device in accordance with claim 3, wherein a second air nozzle (12) is formed on the second bracket (10), which is directed to an aspiration area of the second fan (20.1).

12. The cooling device in accordance with claim 2, wherein a second air nozzle (12) is formed on the second bracket (10), which is directed to an aspiration area of the second fan (20.1).

* * * * *